United States Patent [19]

Schneider et al.

[11] Patent Number: 5,545,995
[45] Date of Patent: Aug. 13, 1996

[54] MEASUREMENT OF GEOMETRIC DISTORTION IN MRI IMAGES

[75] Inventors: Erika Schneider, Clifton Park, N.Y.; Anton M. Linz, Mukwonago; Gregory A. Repinski, Waukesha, both of Wis.

[73] Assignee: General Electric Company, Milwaukee, Wis.

[21] Appl. No.: 346,599

[22] Filed: Nov. 29, 1994

[51] Int. Cl.⁶ .................................................. G01R 33/20
[52] U.S. Cl. ........................... 324/318; 324/308; 324/300
[58] Field of Search ..................................... 324/300, 318, 324/322, 317, 321, 314, 308; 128/653.2

[56] References Cited

U.S. PATENT DOCUMENTS

| | | | |
|---|---|---|---|
| 4,591,789 | 5/1986 | Glover et al. | 324/307 |
| 4,613,819 | 9/1986 | Chui | 324/318 |
| 4,672,320 | 6/1987 | Sekihara et al. | 324/312 |
| 4,777,442 | 10/1988 | Rosenthal | 324/318 |
| 4,791,369 | 12/1988 | Yamamoto et al. | 324/312 |
| 4,818,943 | 4/1989 | Chandra | 324/318 |
| 4,888,555 | 12/1989 | Vaughan et al. | 324/318 |
| 5,070,876 | 12/1991 | Wright | 128/653.3 |
| 5,165,050 | 11/1992 | Goodenough et al. | 324/318 |
| 5,351,006 | 9/1994 | Sumanaweera et al. | 324/309 |
| 5,432,449 | 7/1995 | Ferut et al. | 324/318 |

OTHER PUBLICATIONS

*Analysis of Machine–Dependent and Object–induced Geometric Distortion in 2DFT MR Imaging*, Magnetic Resonance Imaging, vol. 10, pp. 597–608, 1992, C. J. G. Bakker, et al.

*Quantifying MRI Geometric Distortion in Tissue*, MRM 31:40–47 1994, Sumanaweera, et al.

*Correction of Spatial Distortion in MR Imaging: A Prerequisite for Accurate Stereotaxy*, Jour. of Comp. Assis. Tomog., 11(3):499–505, May/Jun. 1987, L. Schad, et al.

*Validation of a New Method for Stereotactic Localization using MR Imaging*, Jour. of Comp. Assis. Tomog., 15(2):291–296, Mar./Apr. 1991, J. Rousseau, et al.

*Theoretical and Experimental Analysis of Geometric Distortions in MRI Imaging*, First Meeting SMR, Mar./1994, J. Bertolina, et al.

*Increasing Stereotaxic Accuracy With High Readout Gradient Sequences*, First Meeting SMR, Mar./1994, J. Bertolina, et al.

Primary Examiner—Sandra L. O'Shea
Assistant Examiner—Raymond Y. Mah
Attorney, Agent, or Firm—Quarles & Brady

[57] ABSTRACT

A calibration procedure for correcting geometric errors in MRI images due to gradient field non-linearities and magnetic field inhomogeneities includes performing a 3D scan on a calibration phantom. The calibration phantom contains an array of tapered rods that produce an array of spots in reconstructed slice images. Spot sizes and positions enable position errors to be measured throughout the bore of the imaging system. Corrective coefficients are produced from these 3D error measurements that enable subsequent patient images to be corrected for warping errors in object position.

10 Claims, 4 Drawing Sheets

MEASUREMENT OF GEOMETRIC DISTORTION IN MRI IMAGES

BACKGROUND OF THE INVENTION

The field of the invention is nuclear magnetic resonance imaging methods and systems. More particularly, the invention relates to the measurement and correction of geometric distortion in MRI images due to magnetic field non-linearities and inhomogeneities.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed to locate the position of the excited spins. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The reconstructed MRI image can be geometrically distorted due to a number of causes. The location of an object, or portions of the object, can be shifted due to changes in the local Larmor resonance frequency. Chemical shift artifacts caused by small differences in Larmor resonance frequency (e.g. fat and water spins), susceptibility differences between different tissues, and patient induced or polarizing magnetic field inhomogeneities are examples of sources for such shifting of position. Another source of distortion is stretching or contracting of the imaged object caused by non-linearity of one or more of the applied gradient magnetic fields. This distortion is referred to as "warping". Both distortions can be very substantial, however, in standard cylindrical magnets used for MR imaging and spectroscopy, warping distortion is usually much greater than the distortion due to shifting. This is particularly true when local gradient coils are employed in lieu of whole body gradient coils, since the field of view over which local coil gradient fields are linear is very limited. In addition to these "static" geometric distortions, time variant and spatially variant gradient eddy currents also contribute to both object shifting and image warping.

Techniques such as those disclosed in U.S. Pat. Nos. 4,591,789 and 4,672,320 have been developed to correct magnitude MRI images for these various types of geometric distortions. These corrections are based on mathematical models of the gradient fields produced by the gradient coil structures. While these models are generally accurate, they do not reflect variations in gradient coil structures due to manufacturing tolerances and changes that may occur in the gradient coil structures during use.

SUMMARY OF THE INVENTION

The present invention is a calibration process and associated phantom which enables automated MRI system calibration of the static gradient field warping and polarizing magnetic field inhomogeneity shifting of the imaged object. More specifically, an image is acquired of a calibration phantom having an array of precisely located rods that extend along one axis of the MRI imager and are tapered such that the cross sectional area of each rod changes as a function of location along the one axis. Geometric distortion is measured along the one axis by measuring a cross sectional dimension of each tapered rod in the image and comparing the dimension with the actual known dimension. The distortion along the other two axes is determined by measuring the position of the rod centers in the image along each of the other two axes and comparing that position with the actual known position. By repeating the process at successive slice locations along the length of the phantom rods, geometric distortion in three dimensions throughout the bore of the MRI scanner can be measured. These measurements can then be used to construct a model of the gradient field non-linearities which is used to correct subsequently acquired patient images.

A general object of the invention is to accurately correct MRI image data for spatial location errors caused by non-linear gradient fields. The calibration phantom is inserted in the bore of the scanner and a series of images using a 3D pulse sequence is acquired. The images are then processed to separate the shifting error caused by field inhomogeneity and then to calculate three dimensional warping error values at locations throughout the bore of the imager. These warping error values are used to adjust the coefficients of a model of gradient field non-linearities used during the subsequent post-processing of patient images to correct for geometric distortion throughout the bore.

DESCRIPTION OF THE PREFERRED EMBODIMENT

Figure 1:
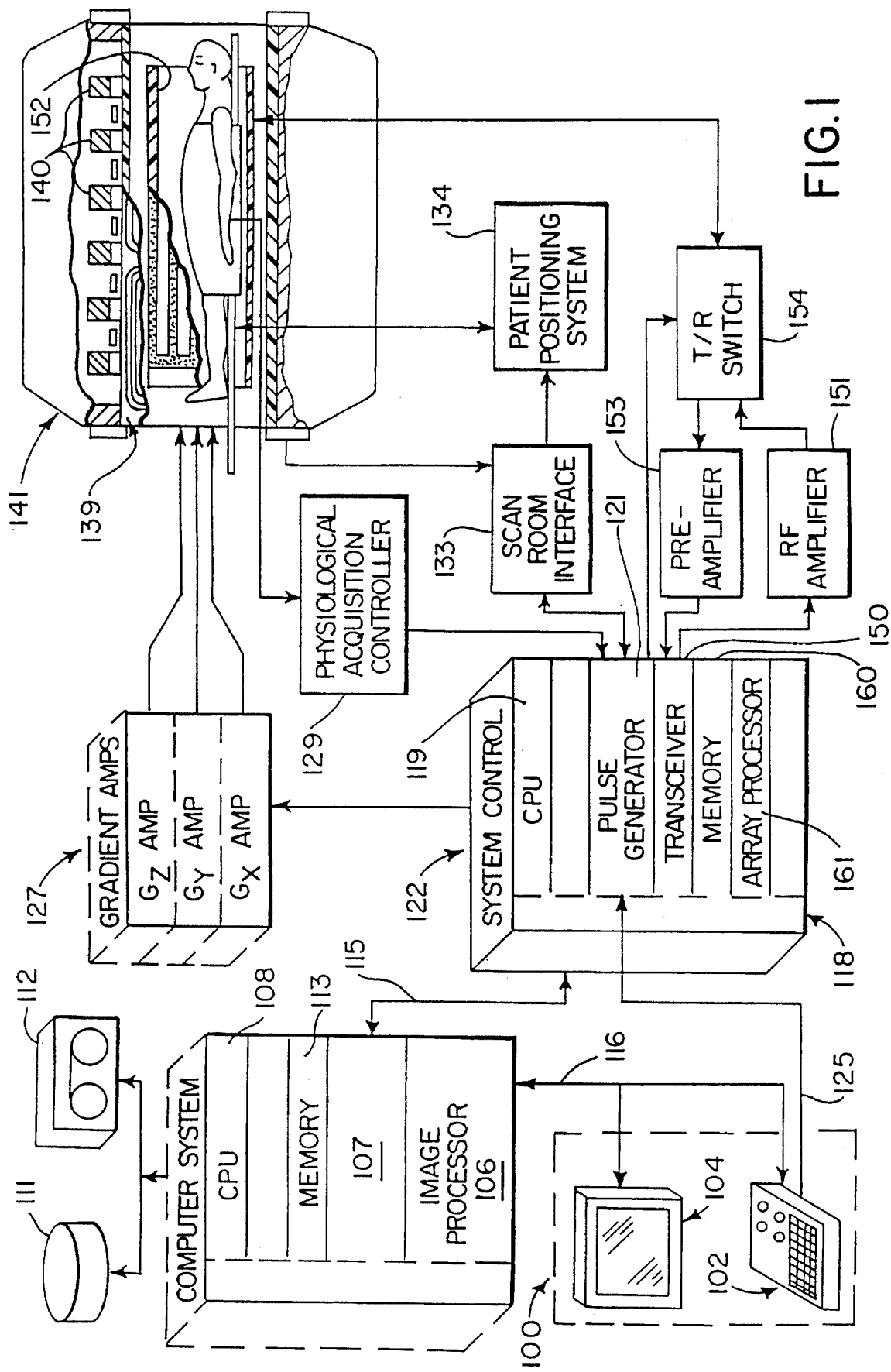
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on external drive 112, or it may be further manipulated by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

The bore of the MRI scanner is a circular cylindrical volume whose diameter is defined by that of the whole-body RF coil 152. A patient is positioned in this bore and a scan is performed in which NMR data is acquired from which one or more images depicting slices through the patient are reconstructed. The present invention is a calibration method which is performed periodically by service personnel using a calibration phantom shown in FIGS. 2 and 3. This calibration phantom is inserted into the scanner bore in place of a patient and image data is acquired as will be described in more detail below. The reconstructed calibration images are processed in the computer system 107 to produce an array of correction values that are used during subsequent patient scans to correct for geometric distortion in the reconstructed images.

Figure 2:
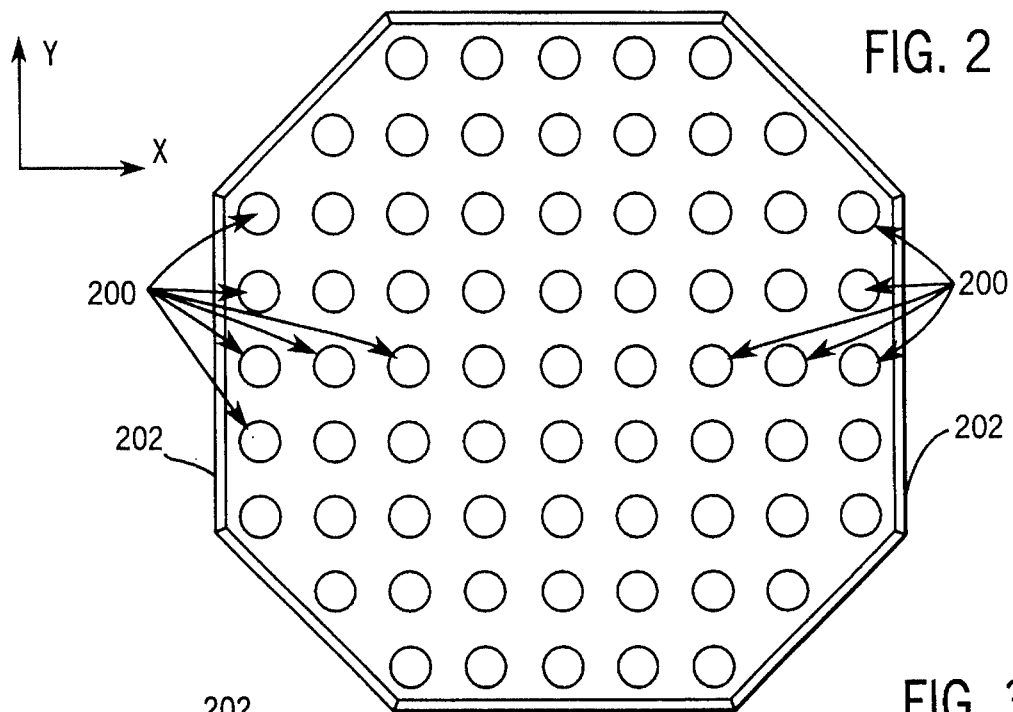
FIG. 2 is a view in cross section taken through an imaging plane in the preferred calibration phantom.
Figure 3:
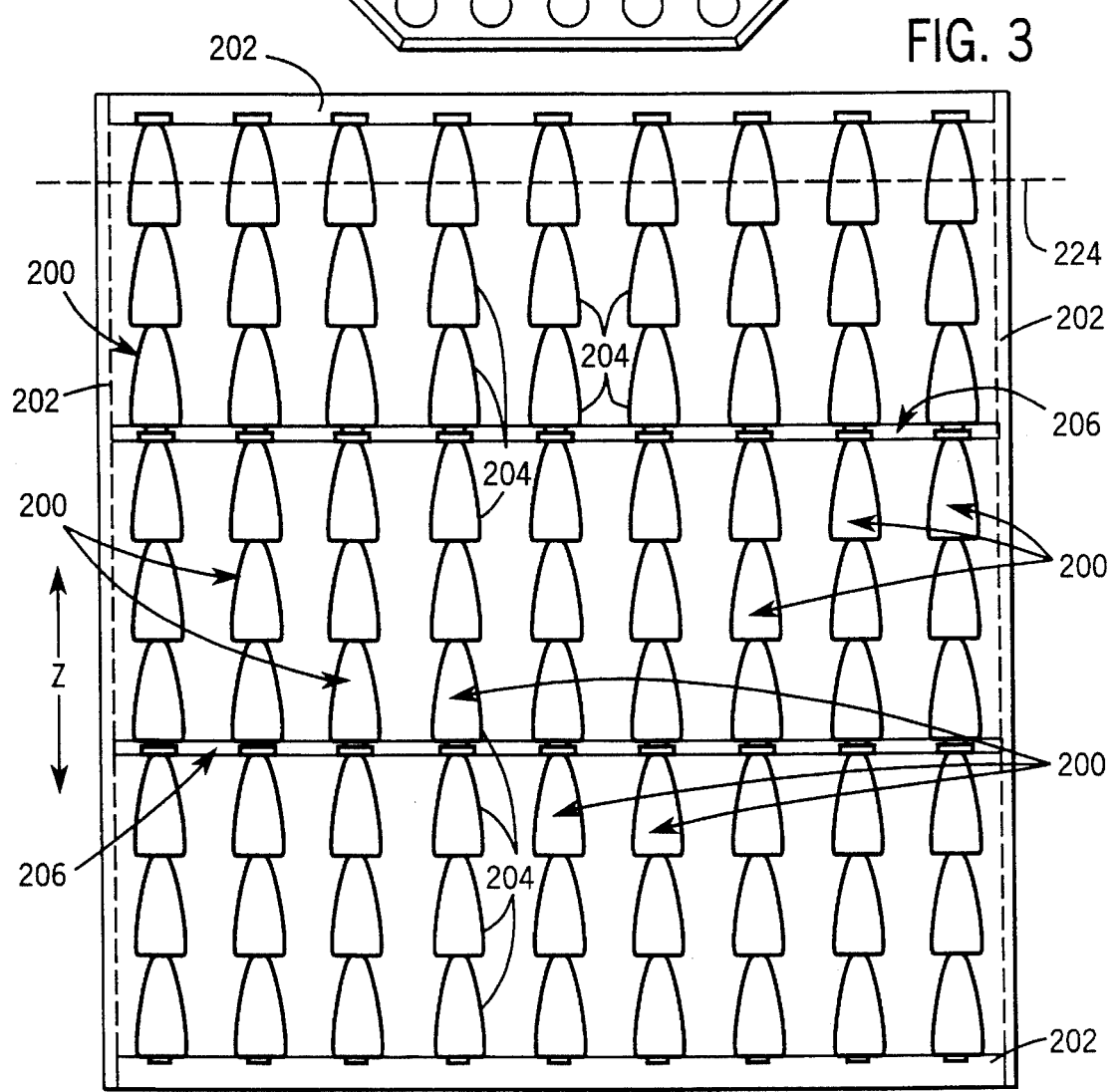
FIG. 3 is a top view of the preferred calibration phantom.

Referring particularly to FIGS. 2 and 3, the calibration phantom is an array of rods 200 supported in an enclosure 202 that fits within the scanner bore and is precisely aligned at the scanner isocenter. Each rod 200 is formed from an acrylic resin plastic and extends along the z axis of the imaging system. Each rod 200 has a cross section which is tapered along its length to form a series of conical-shaped rod segments 204. The rods 200 are supported at each of their ends by the end walls of the enclosure 202 and by two equally spaced interior walls 206. As shown in FIG. 2, the rods 200 are precisely arranged in an array to form rows of rods 200 that are aligned horizontally along the x axis of the imaging system, and columns of rods 200 that are aligned vertically along the y axis. The enclosure 202 is filled with water containing $CuSO_4$ in a solution which has magnetic susceptibility matching that of the rods 200.

An image of the calibration phantom in a plane perpendicular to the rod direction appears as an array 10 of dark circular spots. The centers of the spots indicate apparent rod location along the x and y axes, and the size of the spots indicate apparent slice location along the z axis. While a circular cross section is employed in the preferred embodiment, other tapered shapes such as square or rectangular may also be used to accomplish the same objectives. Each rod segment 204 has a length of 4.0 cm, which is far greater than any expected geometric distortion along the z-axis, and which is short enough to enable a large slope on the sides of the rod segment 204. The larger slope, or taper, produces a bigger change in spot size as a function of slice location along the z-axis, and hence, a more accurate measurement of z-axis distortion. As will be described in more detail below, a set of slice images are produced which lie in the x-y plane and are distributed along the z-axis to pass through each rod segment 204. These images are analyzed to produce error values for gradient field warping along all three axes.

Figure 4:
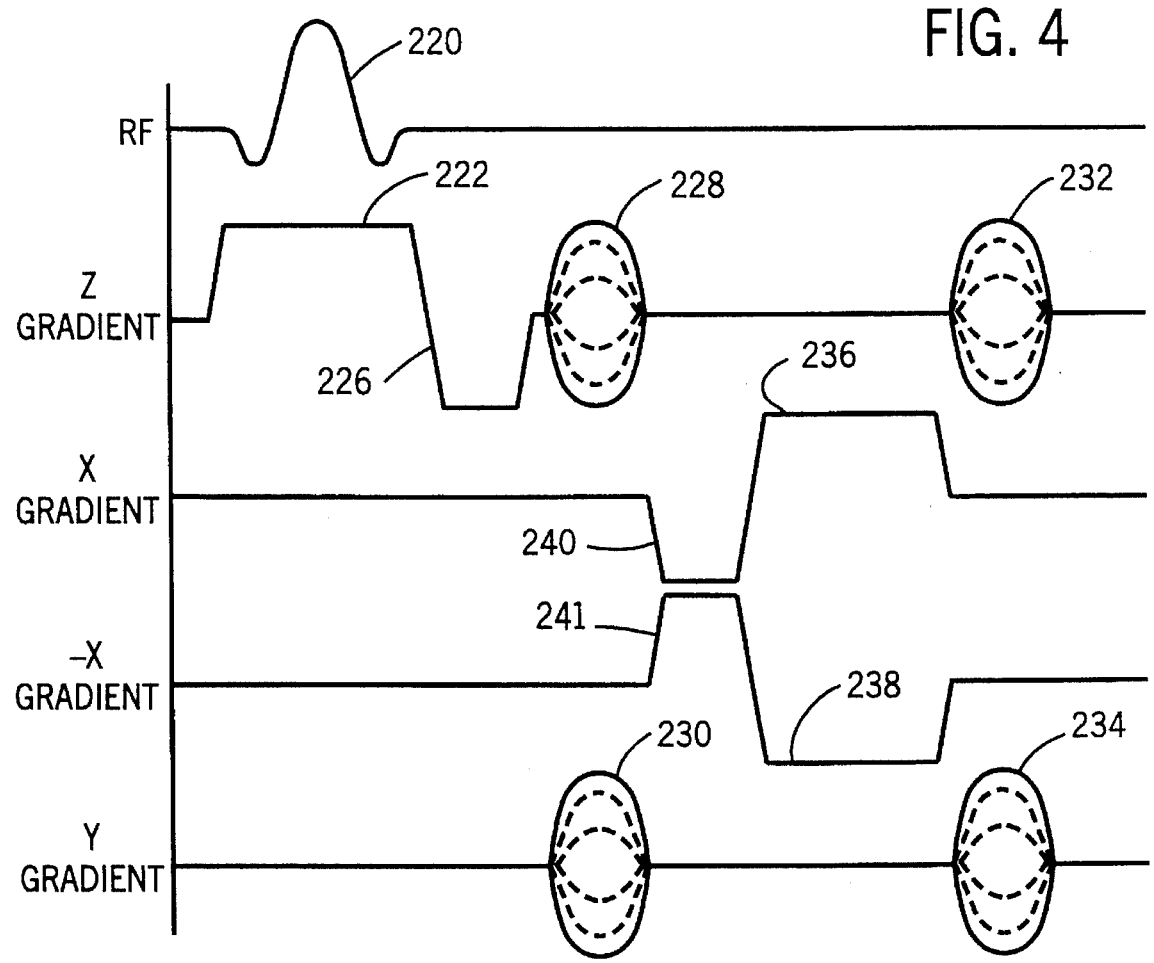
FIG. 4 is a graphic representation of a preferred pulse sequence used to acquire images through successive slices of the calibration phantom of FIG. 3.

Referring particularly to FIG. 4, the pulse sequence used to acquire the calibration images is a 3D gradient-recalled echo pulse sequence. It includes a selective RF excitation pulse 220 which is produced in the presence of a slab-select gradient pulse 222. The gradient pulse 222 is directed along the z-axis and its magnitude is such that the excited slab is positioned through the central region of rod segments 204 as indicated by dashed line 224 in FIG. 3. The bandwidth of the selective RF excitation pulse 220 is such that a slab having a thickness of approximately 2.0 cm is excited. During the scan the frequency offset of the RF pulse 220 is stepped through a set of values which move the excited slab to each of the other rod segments 204.

After a refocusing gradient pulse 226 is applied, phase encoding pulses 228 and 230 are applied along the z and y axes respectively. The magnitudes of the slice and phase encoding pulses 228 and 230 are stepped through a sequence of values in successive pulse sequences to acquire NMR data from a 12×256×256 voxel, 3D volume within the slab. Corresponding rephasing gradient pulses 232 and 234 are applied at the end of the pulse sequence to rephase spins before the next acquisition.

The pulse sequence is repeated twice, first with a positive amplitude readout gradient pulse 236, and then with a negative amplitude readout gradient pulse 238. These are, of course, preceded by dephasing pulses 240 and 241 respectively. As will be described below, the resulting two images at each slice location are used to identify the shift error due to magnetic field inhomogeneities as distinguished from the warping error due to gradient field nonlinearities.

Figure 5:
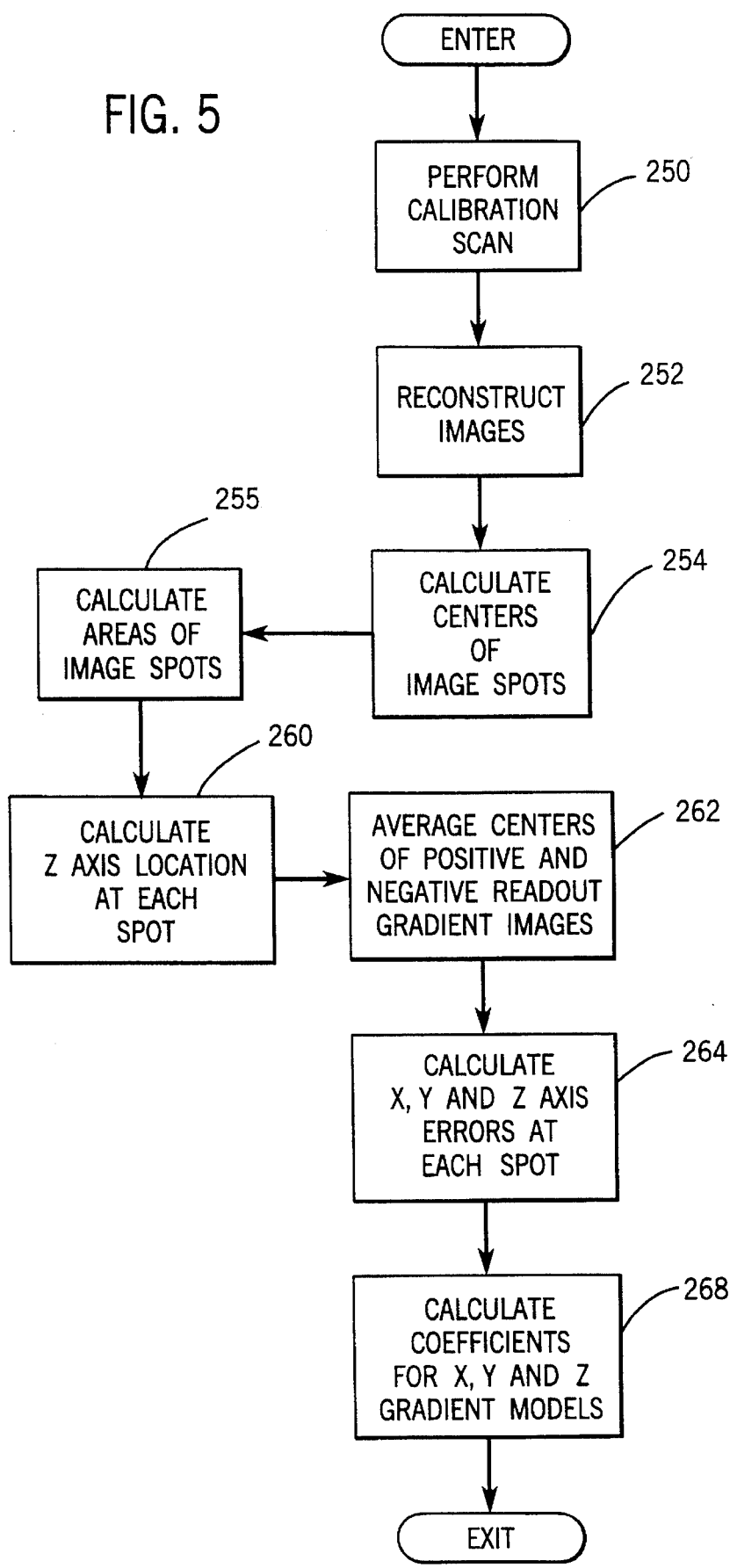
FIG. 5 is a flow chart of the calibration process performed by the MRI system of FIG. 1.

The calibration analysis process according to the preferred embodiment of the present invention is performed under the direction of a program executed by the computer system 107 (FIG. 1) as part of a system calibration conducted periodically by service engineering or quality assurance personnel. Referring particularly to FIG. 5, the first step in this process is to perform a calibration scan as indicated at process block 250 using the above described calibration phantom and pulse sequence. The nine "slabs" of 3D NMR data acquired with a positive readout gradient are processed in a conventional 3DFT image reconstruction process 252 to form nine sets of 3D images having 12 pixels along the Z axis and 256 pixels along each of the x and y axes. The same reconstruction is repeated for the 3D NMR data acquired with a negative readout gradient. Each 3D slab of image data is treated as twelve 256 by 256 pixel 2D slice images in the remaining processing. It should be apparent to those skilled in the art that nine separate 3D slabs need not be acquired. Instead, the 3D NMR data may be acquired as fewer slabs, or even as a single 3D volume.

As indicated at process block 254, the centers of each rod segment 204 in all of the 2D slice images are calculated next. This is accomplished in the preferred embodiment by positioning a mask in the region of each spot and scanning the mask in a correlation process in which the sum of the products of mask pixel magnitudes and image pixel magnitudes is maximized. Using this method the spot centers can be located to within one pixel of accuracy. The resulting x, y center values for each of the twelve slice images are averaged to produce a single spot center array for each of the nine 3D slabs. A spot center array is produced for both the positive readout gradient images and the negative readout gradient images. Those skilled in the art will appreciate that many other image analysis methods for locating each spot in the image slice and finding its center may be used. For example, the image may be filtered to locate all pixels with a magnitude less than a threshold value. The resulting dark regions are then analyzed to determine which are produced by rod segments and the center of mass of these regions are then calculated as rod locations.

Figure 6:
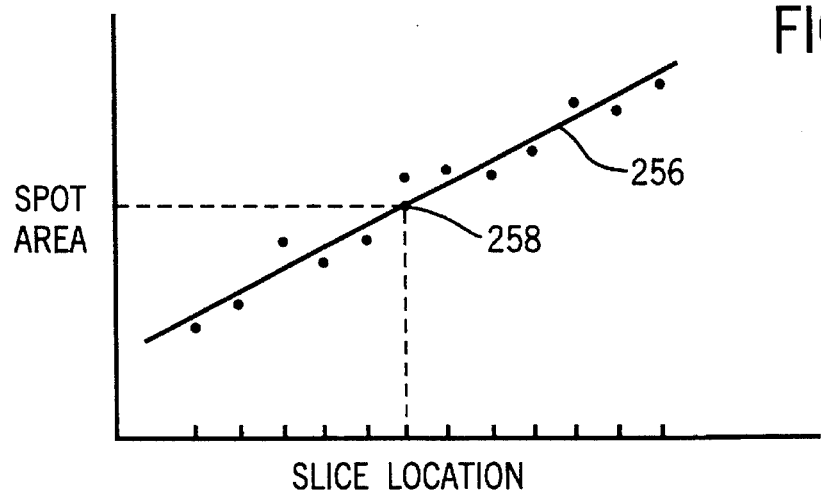
FIG. 6 is a graphic illustration of one step in the calibration process of FIG. 5.

The next step in the process indicated at 255 is to calculate the area of each spot in the nine sets of positive and nine sets of negative 2D slice images. The corresponding values in the positive and negative readout gradient images are averaged to provide twelve area values for each rod segment 204 in the calibration phantom. As shown in FIG. 6 these twelve area values are fit to a straight line 256 and the intersection 258 of this straight line with the center slice is determined. The spot area indicated by this intersection 258 is the measured rod segment cross sectional area.

Referring again to FIG. 5, the apparent slice location along the Z axis is then calculated at process block 260 by converting this measured rod segment area to a z axis location. The rod segments 204 are tapered such that there is a linear relationship between the measured area and the Z axis location. It should be apparent to those skilled in the art that if the rod segments 204 are rectangular in shape rather than circular, the cross-sectional dimensions rather than cross-sectional area may be used to calculate the Z axis location. The circular shape was chosen in the preferred embodiment because it is easier to machine.

Because frequency encoding is employed in the pulse sequence of FIG. 4, spot location is shifted along the readout gradient axis (x) due to field inhomogeneities. As indicated at process block 262, to separate this shift error from gradient field warping errors, the center positions in the positive readout gradient spot center arrays are averaged with the corresponding values in the negative readout gradient spot center arrays.

As indicated at process block 264, the x axis, y axis and z axis errors are then calculated at each point in the averaged spot center arrays by comparing the measured x, y and z values therein with the known phantom rod positions. The central axis of each rod is known and provides the x and y reference values, and the center of each rod segment 204 is the z reference for its corresponding averaged spot center array. A three dimensional array of error values ($\Delta X$, $\Delta Y$ and $\Delta Z$) is thus produced. These error values indicate the geometric distortion at the center of each rod segment 204 in the calibration phantom caused by x, y and z gradient field warping.

If the position of the phantom is not known precisely, the accuracy of the calculated errors ($\Delta x$, $\Delta y$, $\Delta z$) may, in some cases, be improved by taking advantage of the symmetry of the expected error. For example, if the error in the x direction due to gradient field warping is known from the coil geometry to be an even function of x, any odd component of the error in the x direction will be the result of phantom mis-positioning. Thus this odd component may be eliminated from the measurements. Symmetries in the y and z errors may similarly allow corrections for shifts in y and z, as well as correction for phantom rotations.

The final step in the calibration process is to calculate coefficients for a gradient model used to correct patient images as indicated at process block 268. As described in U.S. Pat. No. 4,591,789, a mathematical model is developed for each gradient magnetic field based on a knowledge of the construction of the gradient coil. In prior systems this model is employed in an image post processing step to correct for warping. While such mathematical models are adequate as a general correction, variations in coil structures due to manufacturing tolerances render the models inadequate where precise object position is required in the patient image.

A preferred method for practicing the present invention is to fit the 3D array of error values calculated above to the spherical harmonics model of the gradient field. A least squares method is used to perform this fit. As a result, the coefficients of the mathematical model are adjusted to more accurately indicate the measured non-uniformity in the x, y and z magnetic field gradients. These adjusted coefficients are stored in the system for later use in correcting patient images as described in the above cited patent which is incorporated herein by reference.

In the preferred embodiment the NMR data acquired in the calibration process is used to correct for gradient field warping in all three dimensions. It should be apparent, however, that shifting due to magnetic field inhomogeneity may also be corrected using this calibration data. More specifically the shift in rod centers along the readout gradient axis (x) when the polarity of the readout gradient is reversed is a measure of this geometric error component. These shift errors measured at each rod segment center may be used to fine tune the polarizing field shimming, or to further correct patient images in a post processing step similar to that described above.

It should be apparent to those skilled in the art that while a 3DFT gradient-recalled echo pulse sequence is employed to conduct the calibration scan in the preferred embodiment, other pulse sequences can be used. For example, a spin echo pulse sequence may be used or a 2DFT pulse sequence may be employed. If a 2DFT pulse sequence is used, phase encoding is not employed in the slice selection direction (z). Instead, a conventional slice select gradient is applied with one polarity in the first pulse sequence when the readout gradient is positive, and the polarity of both the slice select gradient pulse and readout gradient pulse are reversed in the next pulse sequence. The frequency offset of the selective RF excitation pulse 220 must also be negated to select the same slice location when the slice select gradient polarity is reversed. The image slices are reconstructed using a conventional 2DFT technique and the processing of the phantom images is the same as described above, except the z axis locations must also be averaged to eliminate shifting errors along that axis.

We claim:

1. A method for calibrating an NMR imaging system for warping errors due to gradient field nonlinearities, the steps comprising:

placing a calibration phantom in a bore of the NMR imaging system, the calibration phantom having an array of tapered rods which extend along one axis of the NMR imaging system and which fill the region in the bore from which image data is to be acquired, performing a scan in which NMR data is acquired from the region;

reconstructing a set of slice images using the acquired NMR data, the slice images showing the location of each tapered rod and a cross sectional dimension thereof at a series of spaced locations along the rods and throughout the region;

analyzing the slice images and calculating a three-dimensional array of error values that indicate the warping errors produced by three orthogonal magnetic field gradients at points throughout the region; and producing corrective coefficients from the array of error values that are employed to correct subsequent images produced on the NMR imaging system.

2. The method as recited in claim 1 in which each tapered rod in the calibration phantom is formed by a series of tapered segments, and the set of slice images are positioned such that a slice image is reconstructed through each tapered segment.

3. The method as recited in claim 1 in which said one axis is a longitudinal axis of the imaging system bore.

4. The method as recited in claim 1 in which the calibration phantom includes a housing that supports the array of tapered rods and contains a liquid that surrounds the tapered rods and has magnetic susceptibility substantially the same as that of the tapered rods.

5. The method as recited in claim 1 in which the scan is performed by executing a first pulse sequence with the NMR imaging system in which a positive readout gradient directed along a second NMR imaging system axis is applied while acquiring NMR data from the region, and executing a second pulse sequence with the NMR imaging system in which a negative readout gradient is applied while acquiring NMR data from the region; and the set of reconstructed slice images includes a first slice image at each slice location reconstructed from NMR data acquired with the first pulse sequence, and a second slice image at each slice location reconstructed from NMR data acquired with the second pulse sequence.

6. The method as recited in claim 5 in which the set of slice images are analyzed by locating the position of each tapered rod in the slice images at each slice location and averaging the locations indicated by the first and second slice images.

7. The method as recited in claim 5 in which the first and second pulse sequences employ a first phase encoding gradient directed along said one NMR imaging system axis and a second phase encoding gradient directed along a third NMR imaging system axis; and the reconstructing of said slice images includes performing a three-dimensional Fourier transformation on the NMR data acquired from the region.

8. The method as recited in claim 6 in which the location of each tapered rod is determined in the slice image by locating the center of the tapered rod image.

9. The method as recited in claim 8 in which the center of each tapered rod image is determined by correlating the reconstructed image with a mask.

10. The method as recited in claim 1 in which the step of analyzing the slice images includes measuring cross sectional size of the tapered rods in the slice image and comparing the measured size with a known size that correlates with spatial location to calculate one of said error values at each tapered rod location in the slice images.

\* \* \* \* \*